United States Patent
Ishikura et al.

(10) Patent No.: US 7,009,219 B1
(45) Date of Patent: *Mar. 7, 2006

(54) DIAMOND ULTRAVIOLET LIGHT-EMITTING DEVICE

(75) Inventors: Takefumi Ishikura, Tokyo (JP); Kenji Horiuchi, Tokyo (JP); Satoshi Yamashita, Tokyo (JP); Aki Kawamura, Tokyo (JP); Kazuo Nakamura, Tokyo (JP); Kenichi Nakamura, Tokyo (JP); Takahiro Ide, Tokyo (JP)

(73) Assignee: Tokyo Gas Co., Ltd., Tokyo (JP)

( * ) Notice: Subject to any disclaimer, the term of this patent is extended or adjusted under 35 U.S.C. 154(b) by 757 days.

This patent is subject to a terminal disclaimer.

(21) Appl. No.: 10/019,308

(22) PCT Filed: Jun. 27, 2000

(86) PCT No.: PCT/JP00/04208

§ 371 (c)(1),
(2), (4) Date: Jan. 8, 2002

(87) PCT Pub. No.: WO01/04965

PCT Pub. Date: Jan. 18, 2001

(30) Foreign Application Priority Data

Jul. 9, 1999  (JP) ........................ H11-195232

(51) Int. Cl.
*H01L 33/00* (2006.01)

(52) U.S. Cl. ............................ 257/103; 257/77; 257/88
(58) Field of Classification Search ................ 257/103
See application file for complete search history.

(56) References Cited

U.S. PATENT DOCUMENTS 6,582,513 B1 * 6/2003 Linares et al. ................ 117/93

FOREIGN PATENT DOCUMENTS

| EP | 0377320 | | 7/1990 |
|----|---------|---|--------|
| EP | 0390209 A2 | | 10/1990 |
| EP | 0918100 A1 | | 5/1999 |
| JP | 02-017631 | * | 1/1990 |
| JP | 03-165074 | | 7/1991 |
| JP | 04-240784 | | 8/1992 |
| JP | 05-140550 | | 6/1993 |
| JP | 07307487 | * | 11/1995 |
| WO | WO99/34646 | | 7/1999 |

OTHER PUBLICATIONS

International Search Report dated Sep. 20, 2000.

* cited by examiner

*Primary Examiner*—Douglas Wille
(74) *Attorney, Agent, or Firm*—Westerman, Hattori, Daniels & Adrian, LLP

(57) ABSTRACT

A small, simple current-injection diamond ultraviolet light-emitting device comprising a high-quality diamond grown by chemical vapor deposition (CVD) method (1), a surface conductive layer (2) provided on the surface of the diamond, and electrodes (4, 5) provided on the surface conductive layer. The device is a free-exciton recombination emission diamond ultraviolet light-emitting device comprising a CVD diamond crystal where the free-exciton recombination radiation (235 nm) caused by current injection is dominant.

17 Claims, 10 Drawing Sheets (D)

(A)

(B)

(A)

(B)

(C)

(D)

DIAMOND ULTRAVIOLET LIGHT-EMITTING DEVICE

FIELD OF THE INVENTION

The present invention relates to a diamond ultraviolet light-emitting device utilizing a chemical vapor deposition (CVD) diamond that emits ultraviolet, capable of applying to the field of optical information read/write processing, photolithography, optical processing, phosphor excitation light source and the like.

SUMMARY OF THE INVENTION

Ultraviolet light characterized in its short wavelength can be utilized for micro fabrication, and there are various demands for ultraviolet technology, such as improving the recording density in the optical read/write processing or improving the packaging density in the micro fabrication of semiconductor devices.

A dutrium lamp and excimer laser are examples of the light source in the ultraviolet wavelength region. However, according to the dutrium lamp, the ultraviolet light emission is low in efficiency and brightness. As for the excimer laser utilizing gas, the devices are inconvenient to use since it is large and requires cooing water, and even dangerous since it utilizes hazardous substance (halogen). Therefore, the conventional ultraviolet light sources had various inconveniences for actual applications.

On the other hand, diamond is also known as a material that emits ultraviolet light. The diamond ultraviolet light-emitting device is small in size, highly efficient, very bright, and is advantageously safe to use.

The conventional diamond light-emitting device is disclosed for example in (1) Japanese Patent Laid-Open Publication No. 4-240784, (2) Japanese Patent Laid-Open Publication No. 7-307487, and (3) Japanese Patent Laid-Open Publication No. 8-330624.

These conventional diamond light-emitting devices are formed by doping boron to the diamond. According to the ultraviolet radiation of the conventional diamond light-emitting device, ultraviolet radiation caused by impurities or lattice defects was dominant, and the free exciton recombination radiation that emits light having a wavelength as short as 235 nm intrinsic to diamond was not dominant. There are explanations on the free exciton recombination radiation in the above publications, but they are merely explanations related to the result of radiating electron beams to the diamond from the exterior and measuring the light emission by a cathode luminescence (CL) method so as to confirm the properties of the diamond.

When considering the diamond ultraviolet light-emitting device, the light emission caused by impurities/defects has a longer wavelength compared to the intrinsic light emission, and therefore it is disadvantageous for composing a short-wavelength light-emitting device. Furthermore, in order to improve the emission intensity, it is necessary to introduce to the diamond crystal high density of defects or high concentration of impurities, and as a result, the quality of the crystal is deteriorated and the intensity of the ultraviolet light emission is reduced. Even further, the introduction of impurities or defects induced a radiation peak at a different wavelength that consumed a portion of the injected energy, deteriorating the efficiency of the useful ultraviolet radiation. Because of the above reasons, the light emissions caused by impurities or defects are not practical for the mechanism of a current-injection light-emitting device.

In comparison, the free exciton recombination radiation is a light emission intrinsic to each material, and generally has the shortest wavelength and a high density of states compared to the variety of other light emissions obtained from the material, so it is most preferable in creating a practical bright light-emitting device. As for the diamond, the intrinsic spectrum related to the free exciton recombination radiation is studied using analyzing methods such as the CL method. The energy of the free exciton recombination radiation of the diamond at room temperature corresponds to a wavelength of 229 nm, but actually, light emissions in the phonon side band group that appear near 235 nm, 242 nm, 249 nm and 257 nm are mainly observed. In general, all of the above are included in the term "free exciton recombination radiation", but the light that is most preferable in an ultraviolet light-emitting device is the light having energy around 235 nm, and in the present specification, this specific light emission is called the "free exciton recombination radiation".

DISCLOSURE OF THE INVENTION

As explained, the conventional diamond ultraviolet light-emitting device includes a light-emitting diamond crystal layer that is poor in quality, containing many impurities or defects. Therefore, even when a diamond crystal is used to realize a current-injection light-emitting device, it is impossible to obtain sufficient radiation intensity of the free exciton recombination radiation (wavelength near 235 nm) that is most advantageous in practical use.

The object of the present invention is to provide using a chemical vapor deposition (CVD) diamond a current-injection excitation light-emitting device in which the free exciton recombination radiation is dominant, the light having the shortest wavelength that is intrinsic to diamond.

For example, according to the spectrum of the light-emitting device disclosed in Japanese Patent Laid-Open Publication No. 7-307487, the intensity of the free exciton recombination radiation (235 nm) that is intrinsic to diamond is clearly smaller than the intensity of the bound excitation radiation (238 nm) that is an example of the impurity/defect-caused radiation. In comparison, in the case of the diamond light-emitting device of the present invention, the free exciton recombination radiation is greater than the intensity of the bound exciton radiation caused by impurities/defects, the former being more than twice greater than the value of the latter in intensity ratio. This is the definition of the ultraviolet radiation in which the free exciton recombination radiation is dominant.

FIG. 10 is referred to in explaining the characteristics of the present invention in further detail.

FIG. 10 is a schematic spectra view showing the light emission status caused by current injection in the ultraviolet region according to the diamond light-emitting device of the present invention and that of the conventional diamond light-emitting device. The solid line represents the performance of the diamond light-emitting device according to the present invention, and the broken line represents the performance of the conventional diamond light-emitting device.

It is clearly shown in the drawing that the diamond light-emitting device according to the present invention shows a main peak at 235 nm, which means that the radiation is caused by the free exciton recombination radiation, and the main peak is extremely greater than the intensity at 238 nm of the bound exciton radiation caused by boron impurity.

On the other hand, according to the conventional diamond light-emitting device, the main peak is observed at 238 nm the bound exciton radiation caused by the boron impurity, and shows only small intensity at 235 nm that corresponds to the free exciton recombination radiation.

In other words, the present invention enables to generate an ultraviolet light emission in which the free exciton recombination radiation is dominant.

In order to achieve the above objects, the present invention proposes in claim 1 a diamond ultraviolet light-emitting device utilizing a CVD diamond crystal that is excited and emits light when current is injected thereto, wherein the free exciton recombination radiation is dominant.

Claim 2 refers to the diamond ultraviolet light-emitting device according to claim 1 in which the free exciton recombination radiation exited by current injection is dominant, and defines that the peak intensity of the free exciton recombination radiation is greater than at least twice the peak intensity of other radiations in the wavelength band of 300 nm or shorter.

Claim 3 refers to the diamond ultraviolet light-emitting device according to claim 1 or 2, wherein the nitrogen concentration within the CVD diamond crystal is 90 ppm or less.

Claim 4 refers to the diamond ultraviolet light-emitting device according to any one of claims 1 through 3, wherein the nitrogen concentration in the plasma when growing the CVD diamond crystal is 200 ppm or less in the ratio of nitrogen atoms/carbon atoms.

Claim 5 refers to the diamond ultraviolet light-emitting device according to any one of claims 1 through 4, wherein the CVD diamond crystal is monocrystal.

Claim 6 refers to the diamond ultraviolet light-emitting device according to any one of claims 1 through 5, wherein the CVD diamond crystal is a CVD diamond crystal grown homoepitaxially.

Claim 7 refers to the diamond ultraviolet light-emitting device according to any one of claims 1 through 4, wherein the CVD diamond crystal is polycrystal.

Claim 8 refers to the diamond ultraviolet light-emitting device according to any one of claims 1 through 7, wherein the CVD diamond crystal is a crystal at the growth-surface side.

Claim 9 refers to the diamond ultraviolet light-emitting device according to any one of claims 1 through 8, wherein the CVD diamond crystal emits the free exciton recombination radiation according to cathodoluminescence spectrum at room temperature.

Claim 10 refers to the diamond ultraviolet light-emitting device according to any one of claims 1 through 9, wherein the CVD diamond crystal is characterized in that the intensity ratio of the free exciton recombination radiation against visible radiation is 0.2 times or greater according to cathodoluminescence spectrum at −190° C.

Claim 11 refers to the diamond ultraviolet light-emitting device according to any one of claims 1 through 10, wherein the CVD diamond crystal comprises a conductive layer at the surface thereof, and electrodes formed on the conductive layer.

Claim 12 refers to the diamond ultraviolet light-emitting device according to any one of claims 1 through 11, wherein the CVD diamond crystal comprises a conductive layer at the surface thereof formed by hydrogen termination, and electrodes formed on the hydrogen termination layer.

Claim 13 refers to the diamond ultraviolet light-emitting device according to any one of claims 1 through 12, wherein conductivity is provided to the CVD diamond crystal by doping boron thereto.

Claim 14 refers to the diamond ultraviolet light-emitting device according to any one of claims 1 through 13, wherein the boron concentration within the CVD diamond is 60 ppm or less.

Claim 15 refers to the diamond ultraviolet light-emitting device according to any one of claims 1 through 14, wherein the concentration of boron within the plasma when growing the CVD diamond crystal is 1000 ppm or less in ratio of boron atoms/carbon atoms.

Claim 16 refers to the diamond ultraviolet light-emitting device according to any one of claims 1 through 15, wherein the effective acceptor concentration within the CVD diamond crystal is 20 ppm or less in quantification based on infrared absorption spectroscopy.

Claim 17 refers to the diamond ultraviolet light-emitting device according to any one of claims 1 through 16, wherein according to the CVD diamond crystal, the free exciton recombination radiation is 0.1 times or greater in peak intensity than the boron bound exciton recombination radiation according to cathodoluminescence spectrum at −190° C.

DETAILED DESCRIPTION OF PREFERRED EMBODIMENTS

The structure of a diamond ultraviolet light-emitting device utilizing a CVD diamond according to the preferred embodiment of the present invention will now be explained in detail with reference to FIG. 1.

Figure 1:
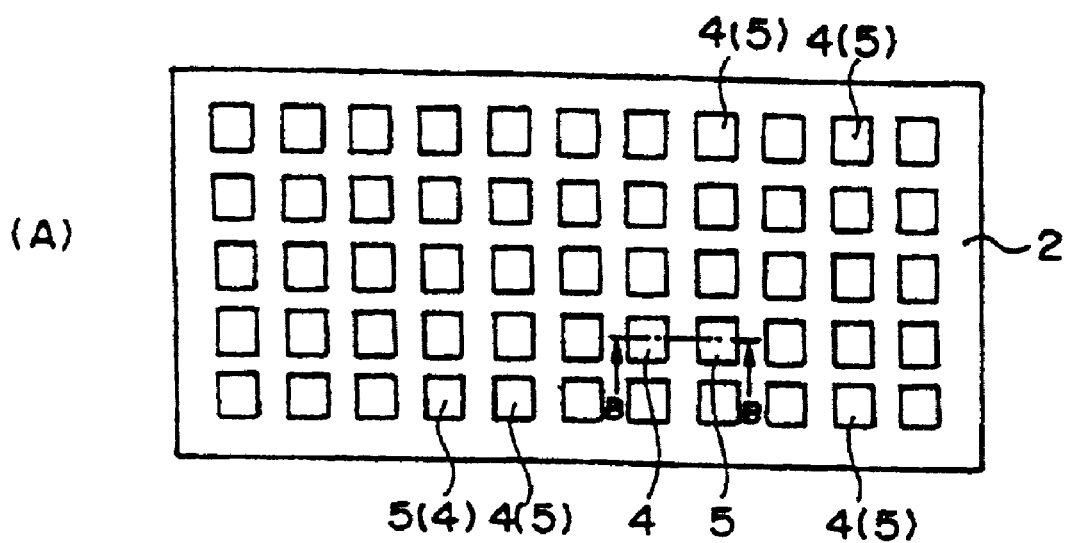
FIG. 1 is a conceptual diagram showing the diamond ultraviolet light-emitting device utilizing the hydrogen terminated diamond polycrystal film according to the first embodiment of the present invention.
Figure 1:
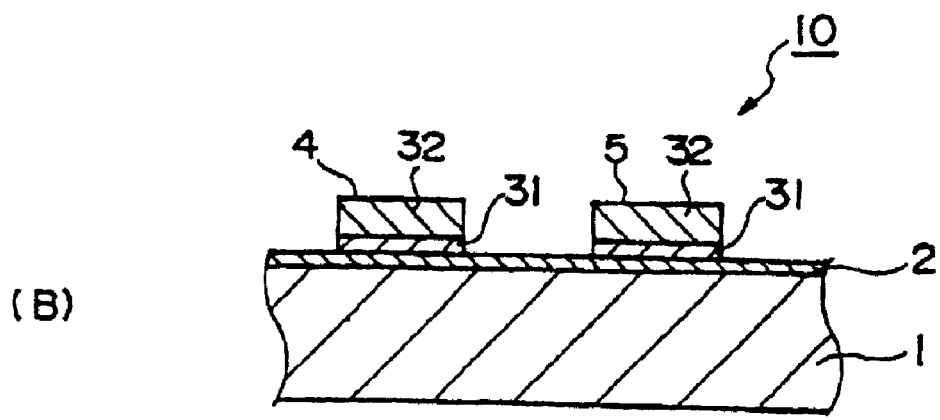

FIG. 1 (A) is a planery view showing a typical state where multiple electrodes are formed on a diamond crystal substrate, and FIG. 1 (B) is a cross-sectional view showing an enlarged view of the cross-section taken at line B—B of FIG. 1 (A). This embodiment is hereinafter called embodiment 1.

The present ultraviolet light-emitting device utilizing the free-exciton recombination radiation is formed using a diamond polycrystal film having hydrogen-termination performed to the surface thereof.

A diamond ultraviolet light-emitting device 10 utilizing this hydrogen-terminated diamond polycrystal film comprises a high-quality diamond crystal layer 1 obtained by the CVD method and including only a slight amount of lattice defects or impurities other than the dopant, a surface conductive layer 2 that is formed by processing the surface of the diamond crystal layer 1 with a hydrogen-termination process so as to provide electrical conductivity thereto, and first electrodes 4 and second electrodes 5 formed on the hydrogen-terminated layer. The first electrodes 4 and second electrodes 5 are each formed of a chromium (Cr) layer 31 formed on the surface of the hydrogen-termination layer 2 so as to provide good adhesiveness with the diamond, and a gold (Au) layer 32 formed on top of the Cr layer.

The diamond crystal layer 1 forming the diamond ultraviolet light-emitting device 10 using the hydrogen-terminated diamond polycrystal film is formed on a molybdenum (Mo) substrate by an inductively-coupled radiofrequency thermal plasma CVD method (RF thermal plasma CVD method). The present diamond crystal layer 1 is formed as an undoped CVD crystal, fabricating a high-quality diamond crystal that only includes a slight amount of impurity or lattice defect.

The present diamond thick-film is manufactured under the following conditions of growth.

[Conditions of Growth]

RF input: 45 kW

Pressure: 200 Torr

Gas: Ar; 31.8 liter/min, $H_2$; 11.2 liter/min, $CH_4$; 0.17 liter/min

Gas purity: Ar; 99.9999%, $H_2$; 99.99999%, $CH_4$; 99.9999%

Growth time: 30 hours

Substrate temperature: approx. 900° C.

Substrate: molybdenum (Mo) plate, diameter: 50 mm, thickness: 5 mm

Film thickness: 100 μm

After growing the film, the Mo substrate on which the diamond thick-film is grown is dissolved using acid, thereby obtaining an independent diamond film.

Raman scattering spetroscopy will now be explained. Raman scattering is a phenomenon where the photon radiated into the sample interacts with the phonon within the crystal and is re-emitted as a photon having a lower energy than the initial by the energy of the phonon. A Raman scattering spectroscopy is a sample evaluation method by analyzing spectrum of the radiated light (scattered light), so as to obtain information such as the lattice defect, stress, impurities and the like in the crystal structure.

In a diamond crystal, the intrinsic Raman scattering peak appears between 1332 [1/cm] and 1333 [1/cm]. The full width at half maximum of the peak is especially sensitive to lattice defect density and nitrogen density, and becomes narrower as the lattice defect density or the impurity concentration other than the dopant such as nitrogen becomes smaller. Therefore, Raman scattering is effective for evaluating the crystal of the ultraviolet light-emitting device wherein the free exciton recombination radiation excited by injecting current in the diamond is emitted as the main light emission.

As a result of the measurement using the Raman spectroscopy wherein an Ar laser excitation (wavelength approximately 514.5 nm) is used to measure the Raman spectrum, the full width at half maximum of the diamond intrinsic scattering peak near the Raman shift 1332–1333 [1/cm] became narrower near the upper portion of the film cross-section than the lower portion. At the uppermost area of the film, the full width at half maximum of the intrinsic peak became smaller than approximately 2.0 [1/cm]. That is, the crystallinity of the diamond is more advantageous at the growth surface side than the back surface of the film near the substrate. In this example, the full width at half maximum of the peak value is called FWHM.

The following is an explanation on the CL measurement. CL measurement is a sample evaluation method where electron beam is radiated on a sample placed in vacuum, and the light emitted from the sample is measured as spectrum. The spectrum varies according to the sample temperature.

The free exciton recombination radiation measured by the above evaluation method is blocked by the existence of impurities or low concentration of lattice defect, so when the intensity of the light emission increases, the completeness of the diamond is considered to be higher.

According to the evaluation obtained by measuring the emission spectrum according to the CL method, the ultraviolet light emission by the free exciton recombination radiation which is intrinsic to diamond is stronger at the growth surface side (upper side) of the diamond, and the visible light emission caused by impurities or defects is stronger near the side adjoining the substrate (lower side). In other words, the growth surface of the polycrystal diamond has higher quality with little defects, but crystallinity of the surface adjacent to the substrate is much lower.

The diamond layer (polycrystal diamond) 1 manufactured by the above-mentioned RF thermal plasma CVD method has a flat surface that contacts the substrate, but the growing surface is rough and uneven, so there is a need to polish the growing surface using a diamond paste so as to smoothen the surface.

The diamond film 1 having both surfaces smoothed is cut into a plate-like shape with a size of approximately 1 mm+2 mm.

This undoped CVD diamond film 1 is insulative, so it is necessary to provide a hydrogen termination process to the surface thereof within hydrogen plasma using a microwave plasma chemical vapor deposition equipment (MW-CVD) in order to provide electric conductivity to the surface thereof. By this process, the surface of the diamond film 1 becomes hydrogen-terminated and comprises conductivity.

The method of hydrogen-terminating the surface of the CVD diamond film is disclosed for example in Japanese Patent Laid-open publication No. 8-139109. Here, hydrogen-termination refers to a state where hydrogen atoms are bonded to the dangling bonds of carbon atoms on the surface of the diamond crystal being grown. For example, a hydrogen-terminated diamond crystal can be obtained by processing the diamond crystal in hydrogen plasma.

The surface hydrogen-terminating process is performed under the conditions mentioned below.

[Conditions for Surface Hydrogen Terminating Process]
MW output: 600 W
Hydrogen flow rate: 500 ml/min
Processing time: 10 min
Substrate temperature: 900° C.
Cooling time: 30 min Hydrogen gas is continuously flown even during cooling time, so as to improve the completeness of the process.

Electrodes are formed on the hydrogen-terminated layer of the diamond crystal film. The manufacturing steps of the electrodes will now be explained with reference to FIG. 2.

Figure 2:
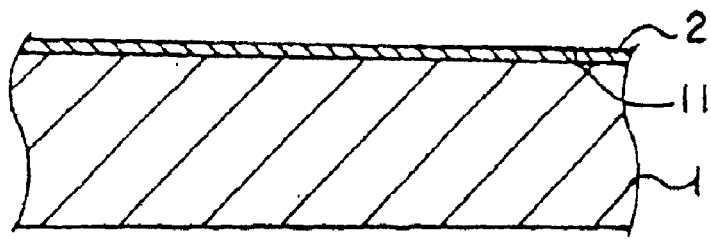
FIG. 2 is an explanatory view showing the manufacturing steps of the diamond ultraviolet light-emitting device utilizing the CVD diamond crystal according to the present invention.
Figure 2:
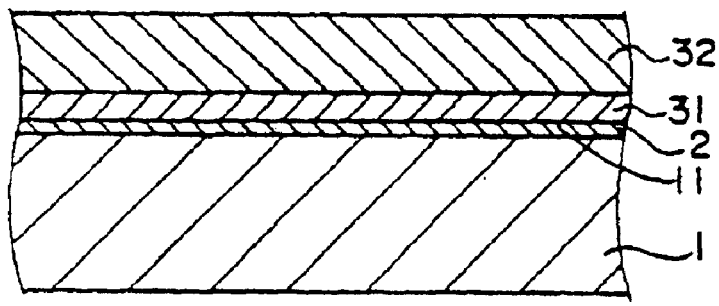
Figure 2:
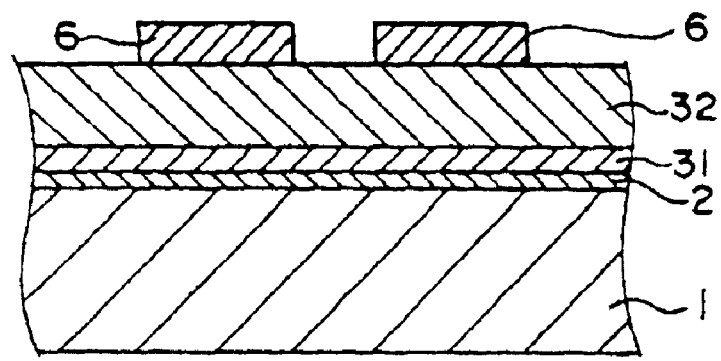
Figure 2:
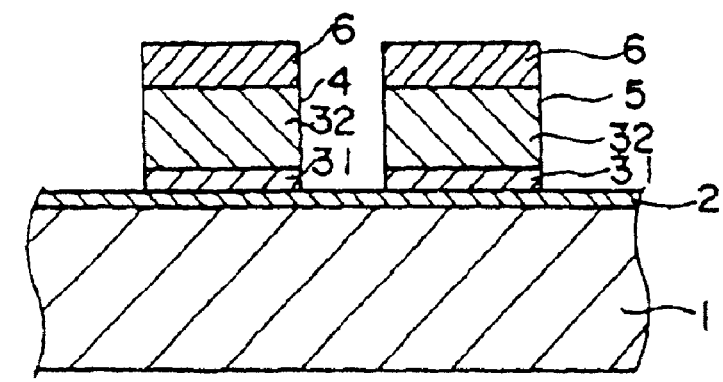

After growing a diamond film on a molybdenum (Mo) substrate using CVD method, the polished surface 11 of the CVD diamond film 1 removed from the substrate and having high quality is hydrogen-terminated using the above process to form a hydrogen terminated layer 2 (FIG. 2 (A)).

Sputtering is performed to the diamond film 1 in a direct current sputtering equipment with chromium target (Cr) for 20 seconds at a substrate temperature of 200° C., a bias voltage of 500 V and current of 1 A, thereby creating a Cr layer 31 having a thickness of 500 Å on the hydrogen-terminated layer 2. Thereafter, sputtering is performed thereto targeting gold (Au) for five minutes with a substrate temperature maintained at 200° C., 700 V and 1 A, thereby creating an Au layer 32 having a thickness of 2000 Å on the Cr layer 31 (FIG. 2 (B)).

Next, a positive photoresist layer is formed on the Au layer 32 for example by spin coating, which is dried for 30 minutes in the atmosphere at 80° C., before exposing ultraviolet light to the unnecessary areas using a mask aligner. Then, the exposed areas are removed using a photoresist developing solution, and then dried for 30 minutes in the atmosphere at 130° C., thereby creating the resist mask 6 (FIG. 2 (C)). This process is performed for example under the following conditions where the photoresist viscosity is 100 Cp, the revolution is 3500 rpm, for 15 seconds, with an ultraviolet exposure of 200 mJ/cm².

This resist mask 6 is used to etch the Au layer 32 and the Cr layer 31, in order to fabricate first electrodes 4 and second electrodes 5 (FIG. 2 (D)). The etching of the Au layer 32 is performed using anmonium iodide solution, and the etching of the Cr layer 31 is performed using cerium anmonium secondary nitrate solution.

Thereafter, acetone is used to remove the resist 6, and then a diamond ultraviolet light-emitting device 10 is formed using the hydrogen-terminated diamond polycrystal film as shown in FIG. 1.

The result of the measurement of current-injection light emission of the diamond ultraviolet light-emitting device 10 utilizing the hydrogen-terminated diamond polycrystal film is explained with reference to FIG. 3.

Figure 3:
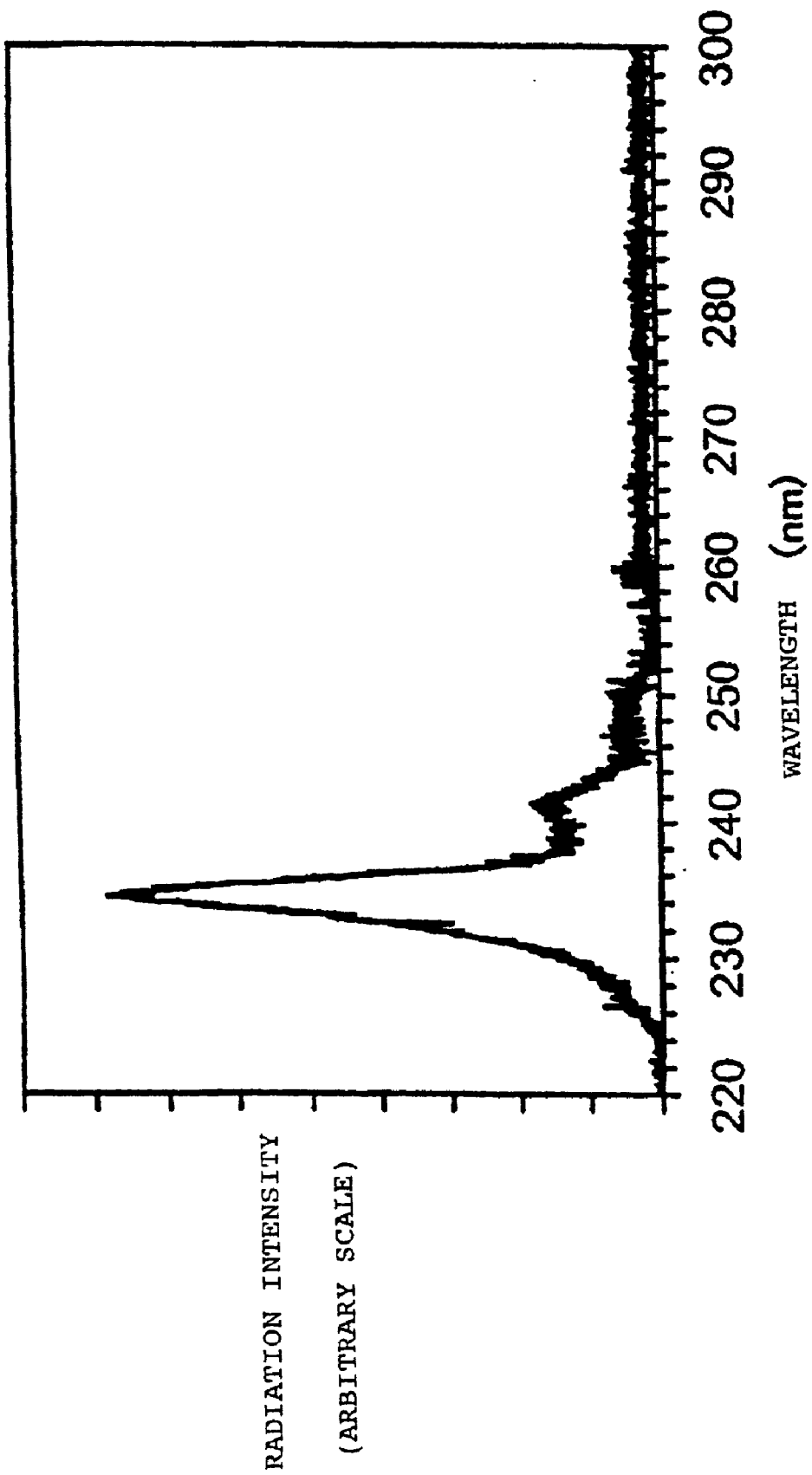
FIG. 3 is a characteristics chart showing the free exciton recombination radiation (ultraviolet radiation) by injecting current to the diamond ultraviolet light-emitting device according to the present invention.

FIG. 3 shows the measured result of the free exciton recombination radiation spectrum that explains the state of the free exciton recombination radiation, wherein the horizontal axis represents the wavelength (nm) and the vertical axis represents the light emission intensity (arbitrary scale).

The sample shows higher crystallinity at the growth surface side when growing the diamond film, so the electrodes are formed to the growth surface side. The measurement is performed by providing a direct current voltage of 220 V between the adjacent electrodes 4 and 5, and flowing a current of 1.0 mA thereto.

As is clearly shown in FIG. 3, the peak exists around 235 nm, and this wavelength can be identified as the ultraviolet light emission of the free exciton recombination radiation caused by current injection. In the wavelength range below 300 nm, the light emission peak caused by impurities or lattice defects is below the detectable intensity limit. From the result of FIG. 3, according to a diamond polycrystal film having a hydrogen-terminated surface, the sample having a high crystallinity shows dominant ultraviolet light emission of the free exciton recombination radiation caused by current injection, that could not be obtained according to the prior art device. According to the prior art, the ultraviolet light emission was mainly caused by impurities or defects. However, the present invention characterizes in that the free exciton recombination radiation is dominant.

The following explains the diamond ultraviolet light-emitting device utilizing a hydrogen-terminated diamond monocrystal film, which is a CVD diamond crystal epitaxially grown on a diamond substrate by microwave plasma chemical vapor deposition method (MW-CVD method). Hereinafter, this embodiment is called embodiment 2.

The structure of the diamond ultraviolet light-emitting device 100 utilizing the hydrogen-terminated diamond monocrystal film according to embodiment 2 will now be explained with reference to FIG. 4.

Figure 4:
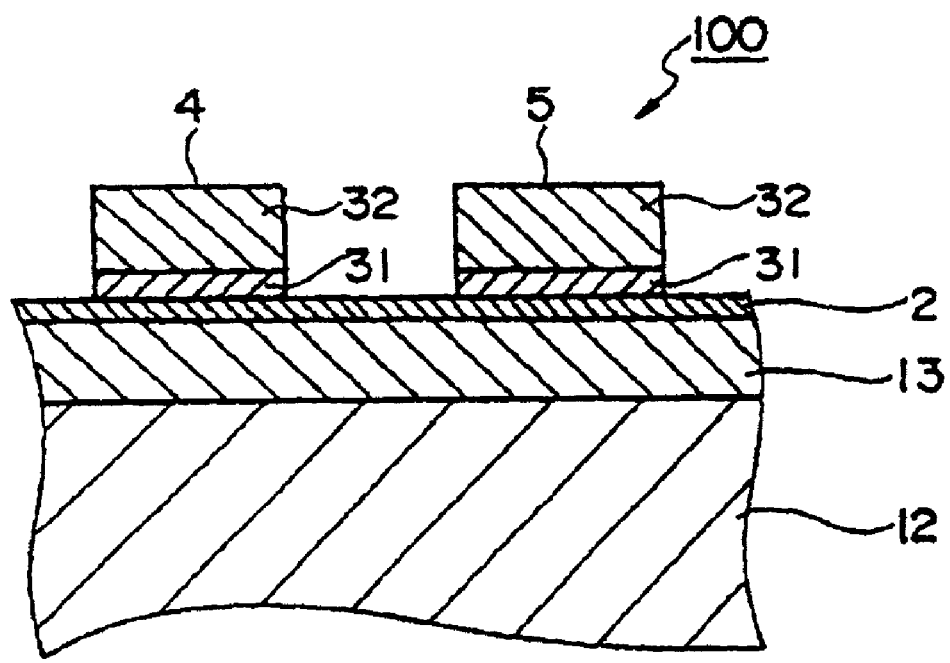
FIG. 4 is a conceptual diagram showing the structure of the diamond ultraviolet light-emitting device utilizing the hydrogen terminated diamond monocrystal film according to the second embodiment of the present invention.

FIG. 4 is a cross-sectional view showing a simplified and enlarged partial cross section of the diamond ultraviolet light-emitting device 100 utilizing the hydrogen-terminated diamond monocrystal, the planery view of which is similar to FIG. 1 (A) and is omitted.

The diamond ultraviolet light-emitting device 100 utilizing the hydrogen-terminated diamond monocrystal is manufactured by homoepitaxially growing a high quality diamond monocrystal film 13 on the surface of a high-pressure synthesized diamond crystal 12, then providing a hydrogen-terminated layer 2 having electrical conductivity on the surface of the diamond monocrystal film 13 by providing a hydrogen-termination process thereto, and finally forming electrodes 4 and 5 on the hydrogen-terminated layer 2 in a similar manner explained in embodiment 1 of FIG. 1. Each electrode 4, 5 comprises a chromium layer 31 and a gold layer 32.

The formation of the homoepitaxially grown diamond crystal film is realized under the following conditions utilizing a MW-CVD equipment.

[Conditions of Growth]
Substrate: 1b (100) high-pressure diamond crystal
MW output: 500 W
Gas: $CH_4$; 0.2% in $H_2$, flow rate 500 ml/min
Gas purity: $CH_4$; 99.9999%, $H_2$; 99.99999%
Temperature: 870° C.
Growth pressure: 40 Torr
Growth time: 64.5 hours After growth, hydrogen is used for processing the crystal for 10 minutes, before cooling it in hydrogen gas.

Since the substrate is made of diamond, the diamond crystal obtained by the above-mentioned process cannot be removed from the substrate, and the homoepaxial film formed by the above process is used together with the substrate in the following processes and measurement.

Since the diamond crystal obtained by the above process is undoped and insulative, hydrogen-termination is performed to the surface thereof under the following conditions so as to provide electrical conductivity thereto.

[Conditions for Surface Hydrogen-Termination Process]
Pressure: 40 Torr
MW output: 600 W
Substrate temperature: 900° C.
Processing time: 10 min
Cooling time: 30 min Thereafter, electrodes 4 and 5 are formed on the surface of the hydrogen-terminated layer 2 of the hydrogen terminated diamond monocrystal 13 obtained by the above process. The manufacturing steps are similar to those disclosed in FIG. 2.

The method for evaluating the quality of the diamond monocrystal obtained by the CL method is explained with reference to FIG. 5.

Figure 5:
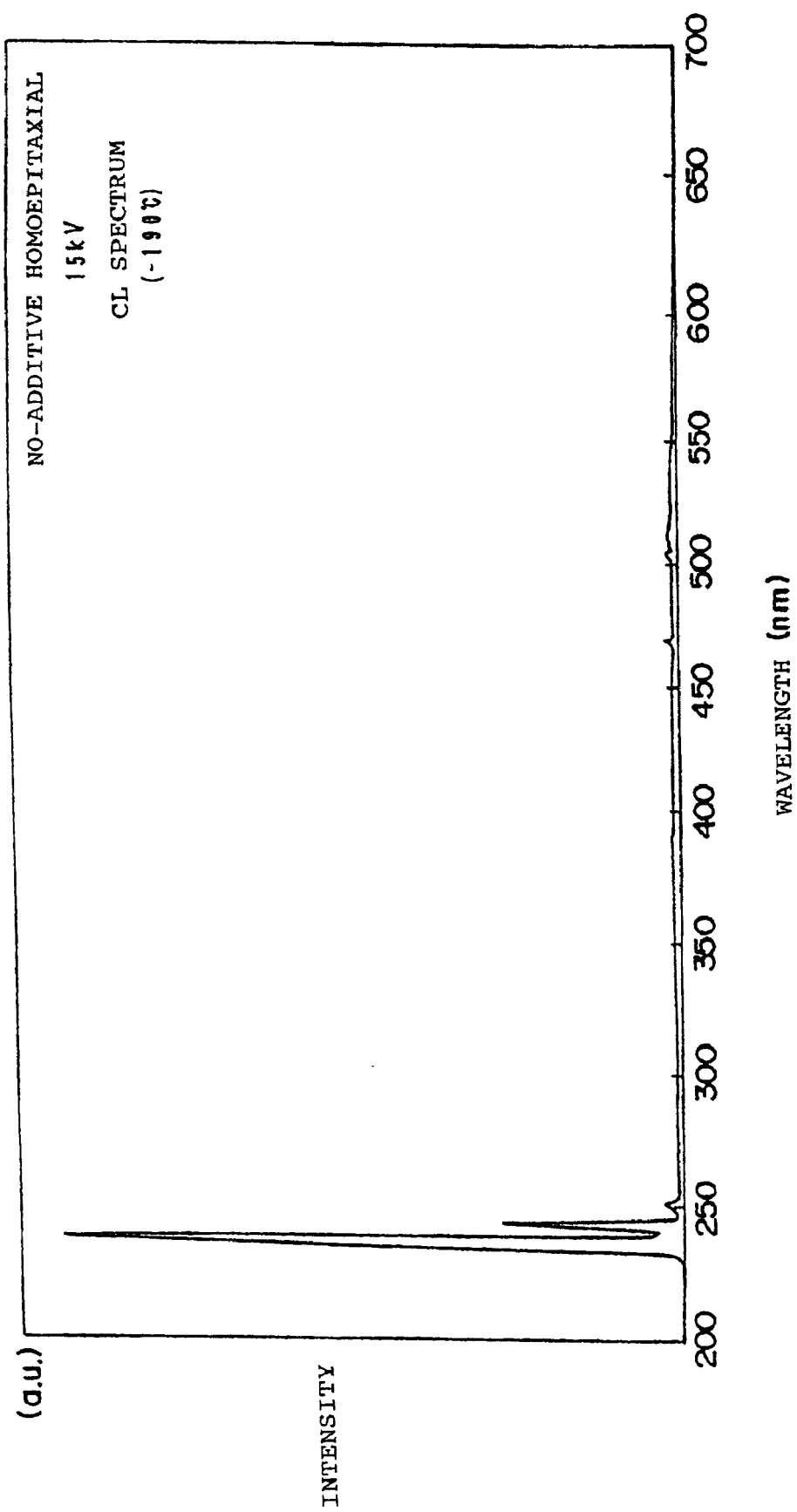
FIG. 5 is a CL spectrum view showing the diamond monocrystal film according to the present invention.

FIG. 5 is a chart showing the wavelength in the horizontal axis (nm: ultraviolet range—visible radiation range), and the vertical axis shows the radiation intensity of the CL in arbitrary scale measured at a temperature of −190° C. in vacuum.

As could be seen from FIG. 5, in the crystal evaluation by CL of the diamond monocrystal film grown homoepitaxially, the free exciton recombination radiation is recognized in the ultraviolet range, but almost no radiation is observed in the visible radiation range caused by lattice defects, so it is clear that the present film has high crystallinity.

The following explains the current-injection radiation characteristics of the diamond ultraviolet light-emitting diode 100 utilizing the present hydrogen-terminated diamond monocrystal film.

The current injection radiation is measured by providing a direct current voltage of 200 V between the adjacent electrodes 4 and 5, and then providing 50 $\mu$A.

Figure 6:
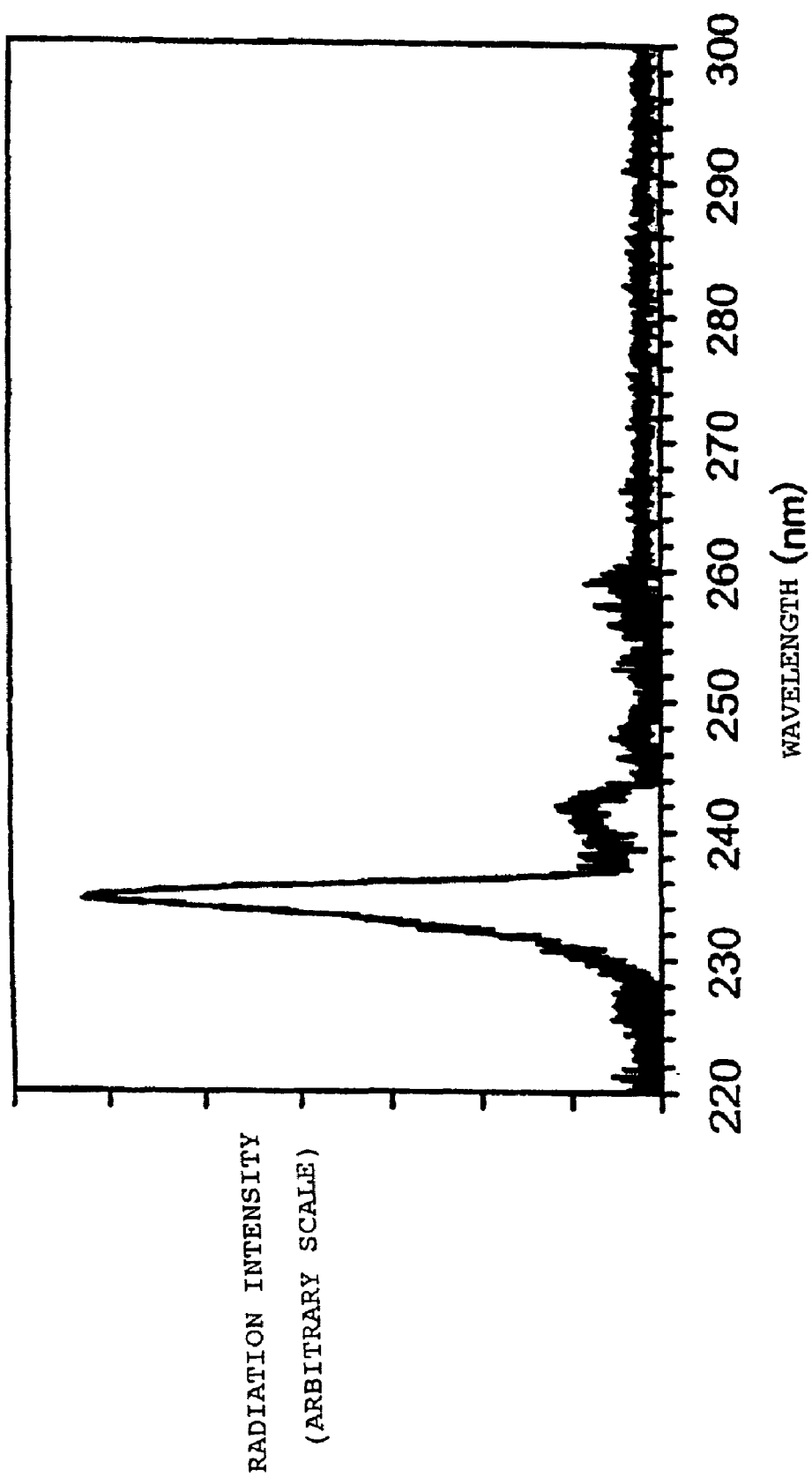
FIG. 6 is a characteristics chart showing the free exciton recombination radiation (ultraviolet radiation) by injecting current to the diamond ultraviolet light-emitting device utilizing the hydrogen terminated diamond monocrystal film according to the present invention.

FIG. 6 explains the state of the free exciton recombination radiation utilizing the hydrogen-terminated diamond monocrystal film, and it shows the spectrum of the free exciton recombination radiation in the ultraviolet range caused by current injection (EL) under room temperature, wherein the horizontal axis shows the wavelength (nm) and the vertical axis shows the radiation intensity (arbitrary scale). As could be seen from the drawing, in a diamond ultraviolet light-emitting device utilizing the hydrogen-terminated MW-CVD homoepitaxially grown diamond monocrystal film, a clear peak exists near 235 nm, and the free exciton recombination radiation is observed. In the range below wavelength of 300 nm, the radiation peaks caused by impurities or lattice defects are below a detectable intensity limit.

Figure 7:
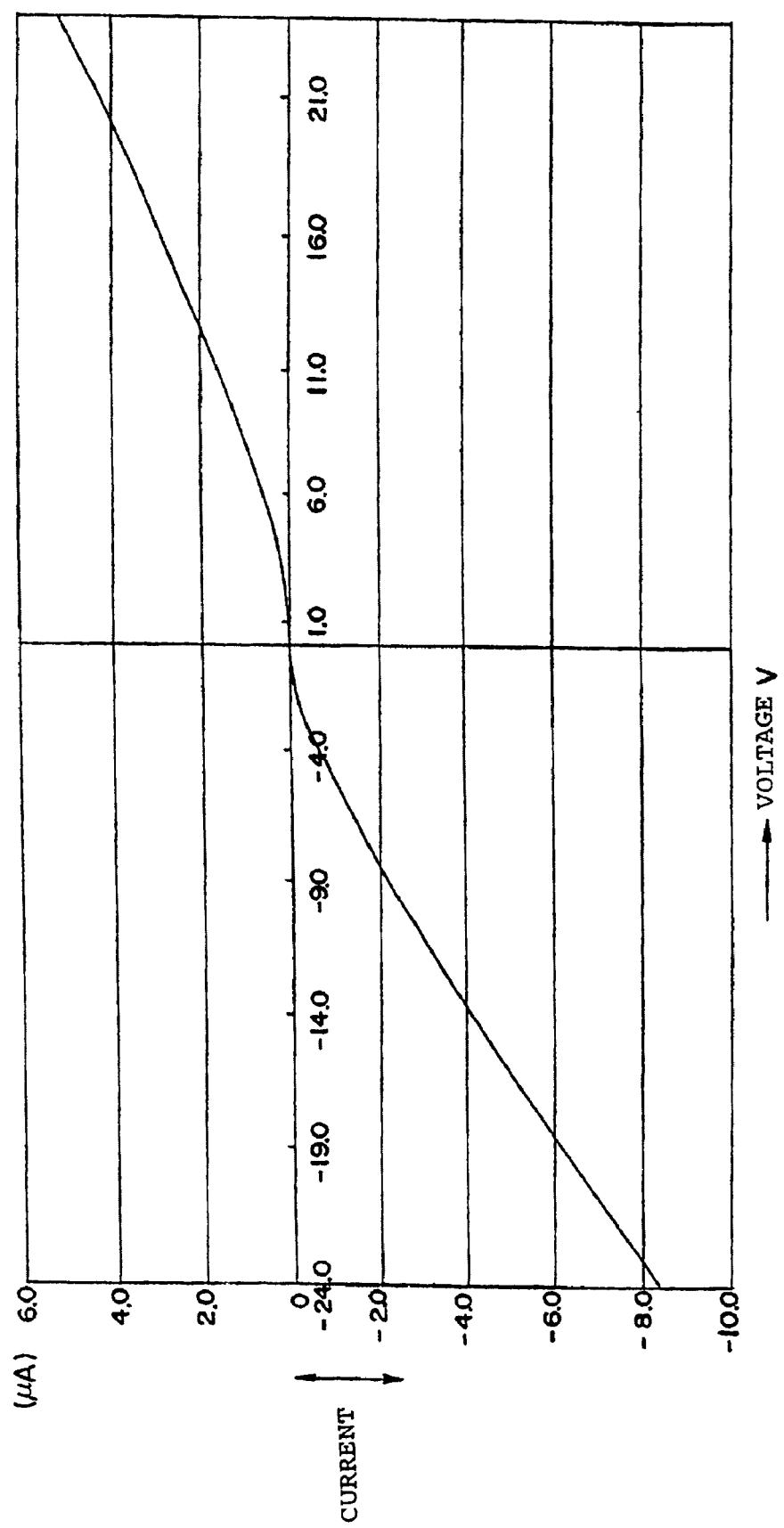
FIG. 7 is a current-voltage characteristics chart of the diamond ultraviolet light-emitting device utilizing the hydrogen-terminated diamond monocrystal layer according to the present invention.

FIG. 7 shows the voltage-current characteristics of the diamond ultraviolet light-emitting device 100 utilizing the hydrogen-terminated MW-CVD homoepitaxially grown diamond monocrystal film shown in FIG. 4.

As a result, even in the diamond ultraviolet light-emitting device 100 utilizing the hydrogen-terminated diamond monocrystal film, an ultraviolet light-emitting diode is obtained where the free exciton recombination radiation caused by current injection under room temperature is dominant.

Next, an example is explained where MW-CVD method is used to dope boron (B) and to realize homoepitaxial growth on a high-pressure synthesized diamond crystal substrate, thereby creating a boron-doped MW-CVD homoepitaxial diamond crystal to be applied to the diamond ultraviolet light-emitting device.

When boron is doped, the diamond becomes a p-type semiconductor, and is provided with electric conductivity. However, in the present invention, the doping of boron is performed so as to realize a current-injection device by providing electric conductivity to the crystal, and not to obtain a radiation caused by boron. This embodiment is hereinafter called embodiment 3.

The structure of the diamond ultraviolet light-emitting device 110 utilizing the boron-doped diamond monocrystal film according to embodiment 3 will be explained with reference to FIG. 8.

Figure 8:
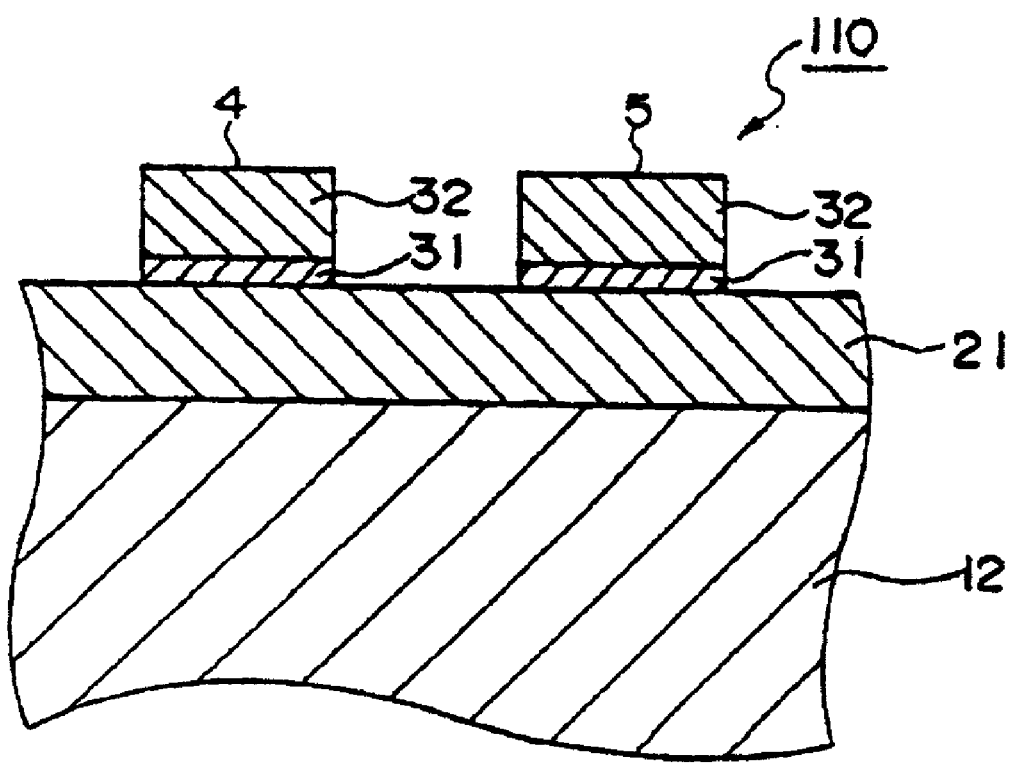
FIG. 8 is a conceptual diagram showing the structure of the diamond ultraviolet light-emitting device using the boron-doped diamond monocrystal film according to the third embodiment of the present invention.

FIG. 8 is a cross-sectional view showing the simplified partially enlarged cross section of the diamond ultraviolet light-emitting device 110 utilizing the boron-doped diamond monocrystal, and the planery view thereof is similar to FIG. 1 (A) so it is omitted.

The diamond ultraviolet light-emitting device 110 utilizing the boron-doped diamond monocrystal is manufactured by homoepitaxially growing a high-quality boron-doped diamond monocrystal film 21 on the surface of the high-pressure synthesized diamond crystal 12, and then forming electrodes 4 and 5 on top of the boron-added diamond monocrystal film 21 in a manner similar to embodiment 1 shown in FIG. 1. Each of the electrodes 4 and 5 comprises a chromium layer 31 and a gold layer 32.

The creation of the boron-doped diamond monocrystal film by homoepitaxial growth is performed using the MW-CVD equipment and under the following conditions.

[Conditions of Growth]

Substrate: 1b (100) high-pressure synthesized diamond crystal

MW output: 600 W

Gas: $CH_4$; 0.1 % in $H_2$, Boron (B); 50 ppm (=B/C), flow rate 500 ml/min

Gas purity: $CH_4$; 99.9999,%, $H_2$; 99.99999%

Temperature: 900° C.

Growth pressure: 40 Torr

Growth time: 135 hours

Process:

Before growth; after cleaning substrate with ethanol, performing $H_2$ plasma treatment for 10 minutes After growth; performing $H_2$ plasma treatment for 10 min, then cooling in $H_2$.

The boron-doped diamond monocrystal film formed according to the above conditions is boiled in sulfuric acid and hydrogen peroxide mixture ($H_2SO_4+H_2O_2$) to remove the surface conductive layer, and then a diamond ultraviolet light-emitting device utilizing the boron-doped MW-CVD homoepitaxially grown diamond crystal film is formed similar to the process shown in FIG. 2.

In the diamond ultraviolet light-emitting device 110 utilizing the boron-doped diamond monocrystal film, a DC voltage of 150 V is applied between electrodes 4 and 5, so as to perform current injection of approximately 1 mA.

Figure 9:
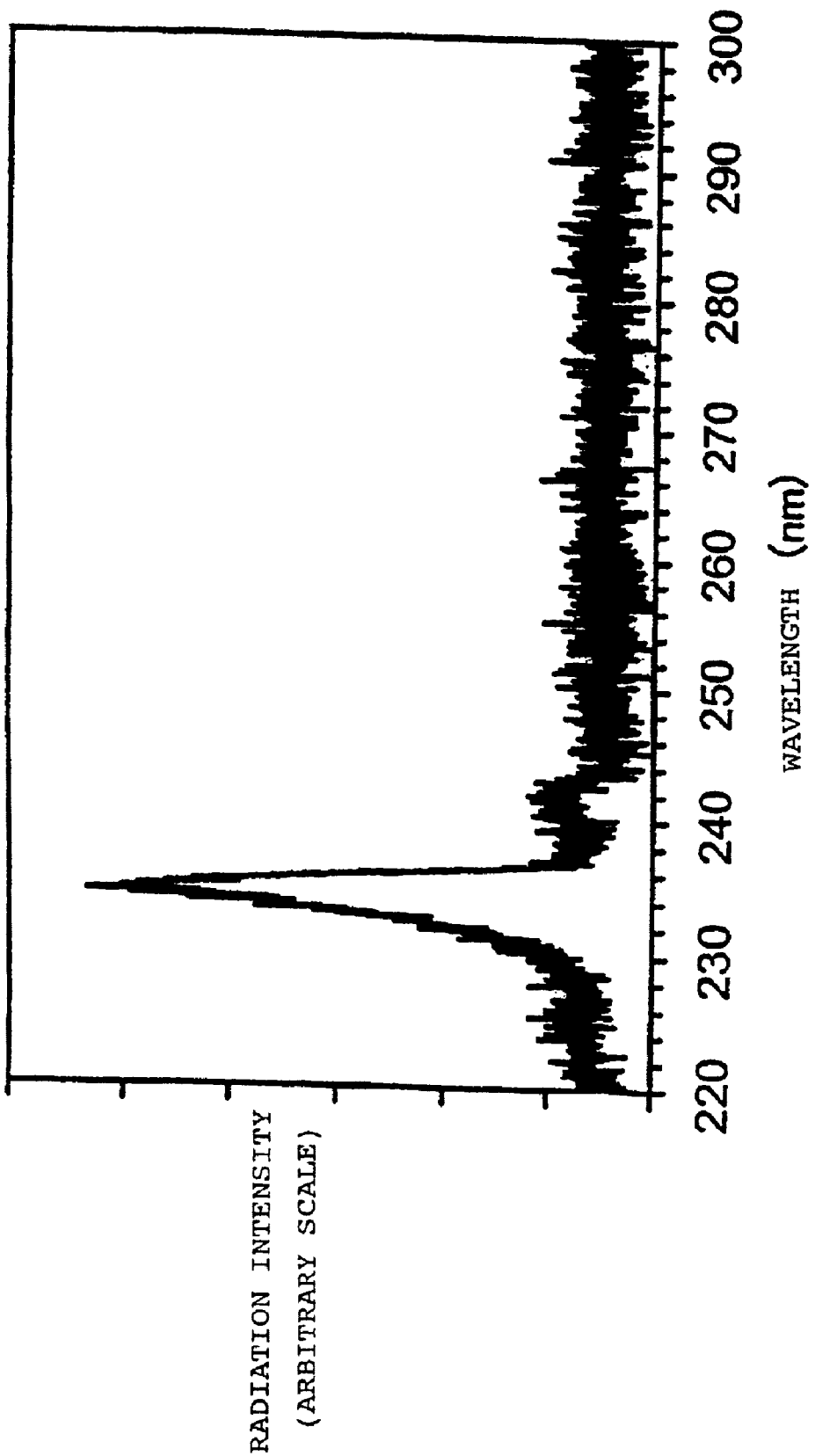
FIG. 9 is a characteristics chart showing the free exciton recombination radiation (ultraviolet radiation) by injecting current to the diamond ultraviolet light-emitting device utilizing the boron-doped diamond monocrystal film according to the present invention.
Figure 10:
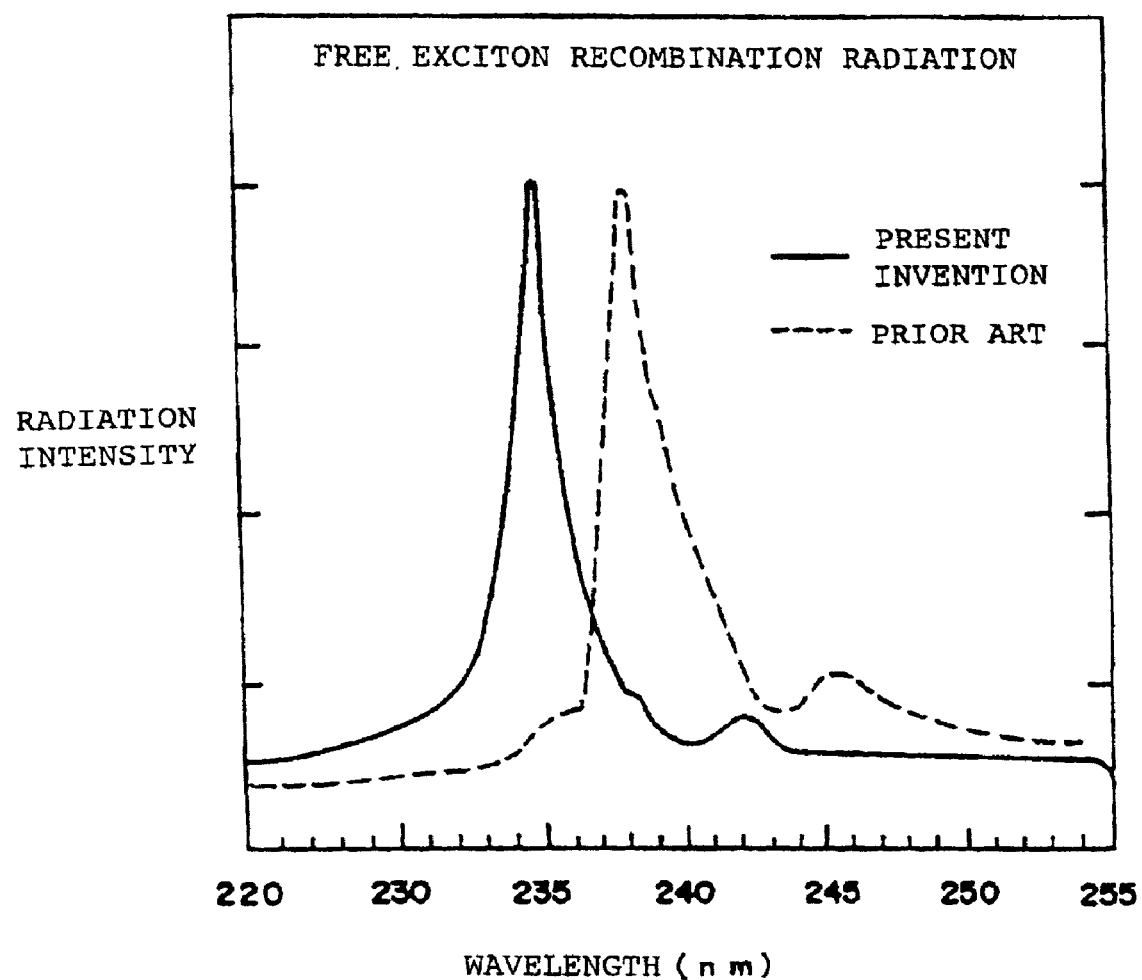
FIG. 10 is a light emission characteristics chart explaining the intensity of the free exciton recombination radiation of the diamond ultraviolet light-emitting device utilizing the CVD diamond according to the present invention and that of the prior-art diamond ultraviolet light-emitting device.

The current injection spectrum under room temperature of the diamond ultraviolet light-emitting device utilizling the above-mentioned boron-doped diamond monocrystal film is explained with reference to FIG. 9. As shown in FIG. 9, an ultraviolet radiation having a peak at 235 nm caused by the free exciton recombination radiation is also obtained by the present device. In the wavelength range below 300 nm, the radiation peak caused by impurities or lattice defects are below a detectable intensity limit.

According to the prior art ultraviolet light-emitting device utilizing the boron-doped diamond crystal, an ultraviolet light-emission caused by the boron-derived bound exciton radiation was dominant. On the other hand, the above-mentioned experiment proved that the diamond ultraviolet light-emitting device utilizing the boron-doped diamond monocrystal film according to the present embodiment characterized in that the ultraviolet radiation caused by the free exciton recombination radiation caused by current injection is dominant. In other words, according to the present embodiment, boron is doped to the diamond crystal film so as to provide electric conductivity thereto, and since the diamond crystal has a high crystallinity, ultraviolet radiation is obtained by current injection as the free exciton recombination radiation intrinsic to diamond.

Embodiment 3 utilized boron-doped diamond monocrystal film formed by growing boron-doped diamond crystal film on a diamond substurate, but other substrates such as silicon or metal can be used instead, and the boron-doped diamond crystal film can be either monocrystal or polycrystal.

The following explains the result of the crystal evaluation by the CL method of the diamond ultraviolet light-emitting device utilizing the CVD diamond crystal according to the present invention, and whether the free exciton recombination radiation caused by current injection is observed or not, with reference to Table 1.

Table 1 shows the radiation characteristics of the diamond ultraviolet light-emitting device utilizing the CVD diamond crystals manufactured through RF thermal plasma CVD method and MW-CVD method.

Here, the light-emitting devices of the sample of embodiments 4 and 5 and the comparison example 1 are manufactured by MW-CVD method similar to embodiment 2. Only the following conditions of composition differ in each manufacturing process.

Embodiment 4: Methane concentration; 1.0%, MW output; 500 W

Embodiment 5: Methane concentration; 0.30%, MW output; 500 W

Comparison example 1: Methane concentration; 0.50%, MW output; 400 W

Further, comparison examples 2 and 3 are manufactured by RF-CVD method similar to embodiment 1. The only point that differs from embodiment 1 is that both comparison examples utilize the surface of the diamond free-standing film positioned adjacent to the substrate. The comparison example 2 is used as it is without polishing, and comparison example 3 is used after polishing the surface for about 10 μm.

TABLE 1

| Sample | Crystallinity evaluation by CL spectrum measurement | | |
|---|---|---|---|
| | Ratio of intensity between free exciton recombination radiation/visible radiation at −190° C. | Free exciton radiation at room temperature | Free exciton recombination radiation by current injection |
| Embodiment 1 | 0.2 | Yes | Yes |
| Embodiment 2 | 6.7 | Yes | Yes |
| Embodiment 4 | 34 | Yes | Yes |
| Embodiment 5 | >100 | Yes | Yes |
| Comparison example 1 | 0.16 | No | No |
| Comparison example 2 | 0.01 | No | No |
| Comparison example 3 | 0.03 | No | No |

In Table 1, the second and third columns show crystallinity evaluations based on CL spectrum measurement, wherein the second column shows the comparison (FE/VB) between the peak intensity FE of the free exciton recombination radiation and the peak intensity VB of visible radiation caused by impurities and defects at −190° C., and the third column shows whether the free exciton recombination radiation was observed or not at room temperature. The fourth column shows whether the free exciton recombination radiation caused by current injection was observed or not.

As can be seen from Table 1, in comparison examples 1 through 3, according to the crystallinity evaluation based on the CL method performed at a temperature of −190° C., the ratio FE/VB is 0.16, 0.01, and 0.03, respectively, but according to the crystallinity evaluation performed at room temperature, no free exciton recombination radiation could be observed in the comparison examples. In this case, no free exciton recombination radiation by current injection was observed at room temperature.

On the other hand, as for the diamond ultraviolet light-emitting device (embodiments 1, 2, 4, 5) of the present invention, according to the crystallinity evaluation by the CL method performed at −190° C., the ratio FE/VB is 0.2, 6.7, 34, and over 100, respectively. Further, according to the crystallinity evaluation by the CL method performed at room temperature, the free exciton recombination radiation is clearly detected in all the examples. Accordingly, the free exciton recombination radiation is clearly obtained by current injection at room temperature.

Based on the above results, it is understood that in order to obtain the diamond ultraviolet light-emitting device, the free exciton recombination radiation intensity must be over 0.2 times the visible light-emitting intensity in the CL spectrum at a temperature of −190° C. It is further understood that in the CL spectrum at room temperature, the free exciton recombination radiation must be observed.

The following is an explanation of the nitrogen concentration dependence of the free exciton recombination radiation in the CVD diamond crystal ultraviolet light-emitting device caused by current injection.

Table 2 shows the measured result of the relation between the amount (ratio) of nitrogen atoms being introduced to the amount of carbon atoms in the atmosphere when growing the CVD diamond crystal for the diamond ultraviolet light-emitting device, and whether the current-injection free exciton recombination radiation is observed or not.

In Table 2, embodiment 2 and comparison examples 4 and 5 all utilize a hydrogen terminated MW-CVD homoepitaxial diamond monocrystal film. The only difference in the manufacturing method for each example is the amount of nitrogen added to the plasma atmosphere based on the following conditions.

Embodiment 2: Ratio of nitrogen atoms/carbon atoms; below 100 ppm

Embodiment 6: Ratio of nitrogen atoms/carbon atoms; 200 ppm

Comparison Example 4: Ratio of nitrogen atoms/carbon atoms; 2000 ppm

Comparison Example 5: Ratio of nitrogen atoms/carbon atoms; 20000 ppm

Further, there is no intended addition of nitrogen in embodiment 2, and the described nitrogen concentration is calculated based on the result of analysis of the components of the methane gas and the hydrogen used for the growth, and the leak quantity of the CVD equipment.

TABLE 2

| Sample | Nitrogen concentration in plasma during growth (ratio of nitrogen atoms/carbon atoms, ppm) | Free exciton recombination radiation caused by current injection |
|---|---|---|
| Embodiment 2 | under 100 | Yes |
| Embodiment 6 | 200 | Yes |
| Comparison example 4 | 2000 | No |
| Comparison example 5 | 20000 | No |

Based on the measured results, it is understood that the number of nitrogen atoms in the atmosphere during growth of the CVD diamond crystal must be equal to or less than 200 ppm in ratio to carbon atoms in order to generate current injection free exciton recombination radiation.

Moreover, the nitrogen concentration within the sample of embodiment 6 is measured by secondary ion mass spectroscopy, the result of which turned out to be 90 ppm. Accordingly, it is understood that in order to fabricate a diamond ultraviolet light-emitting device, the nitrogen concentration within the crystal must be equal to or less than 90 ppm.

The following is an explanation on the boron concentration dependency of the free exciton recombination radiation of the CVD diamond crystal ultraviolet light-emitting device based on current injection.

Tables 3 through 5 show for example the measured result of the relation between the number (ratio) of boron atoms being introduced to the number of carbon atoms in the atmosphere when growing the CVD diamond crystal for the diamond ultraviolet light-emitting device, and whether the current-injection free exciton recombination radiation is observed or not.

Table 3 shows the ratio B/C of the number of boron atoms and the number of carbon atoms within the plasma during the step, and whether the current-injection free exciton recombination radiation is observed or not.

Table 4 shows the active acceptor concentration (ppm) within the crystal based on an infrared absorption (IR) spectroscopy, and whether the current-injection free exciton recombination radiation is observed or not.

Table 5 shows the intensity ratio (FE/BE) of the free exciton recombination radiation and the boron-derived bound exciton recombination radiation based on CL spectrum at −190° C., and whether the current-injection free exciton recombination radiation is observed or not.

TABLE 3

| Sample | Boron concentration in plasma during growth (ratio of boron atoms/carbon atoms, ppm) | Free exciton recombination radiation caused by current injection |
|---|---|---|
| Embodiment 3 | 50 | Yes |
| Embodiment 7 | 1000 | Yes |
| Comparison example 6 | 1500 | No |
| Comparison example 7 | 3000 | No |
| Comparison example 8 | 5000 | No |

TABLE 4

| Sample | Active acceptor concentration within crystal by IR measurement (ppm) | Free exciton recombination radiation caused by current injection |
|---|---|---|
| Embodiment 3 | 2 | Yes |
| Embodiment 7 | 20 | Yes |
| Comparison example 6 | above measurement limit | No |
| Comparison example 7 | above measurement limit | No |
| Comparison example 8 | above measurement limit | No |

TABLE 5

| Sample | FE/BE ratio (*) in CL spectrum at −190° C. | Free exciton recombination radiation caused by current injection |
|---|---|---|
| Embodiment 3 | 2.3 | Yes |
| Embodiment 7 | 0.10 | Yes |
| Comparison example 6 | 0.03 | No |
| Comparison example 7 | Below measurement limit | No |
| Comparison example 8 | Below measurement limit | No |

* ratio of intensity of free exciton recombination radiation/boron-derived bound exciton recombination radiation All the samples used for the above measurement are grown by MW-CVD method, and each homoepitaxially grown diamond film is manufactured under the same conditions listed below, except for the boron concentration.

Substrate: 1b (100) high-pressure synthesized diamond crystal
MW output: 600 W
Gas: $CH_4$; 0.1–1.0% in $H_2$, flowrate; 500 ml/min
Temperature: 850–900° C.
Pressure: 40 Torr In the above Table, B/C shows the amount of trimethyl boron ($B(CH_3)_3$) introduced to material methane ($CH_4$) during CVD process, which is represented by the number ratio of boron atoms/carbon atoms.

In order to quantify the boron concentration, a quantification method using infrared absorption (IR) spectroscopy under room temperature (P. M. Cherenko, H. M. Strong and R. E. Tuft, Phil. Mag., vol. 23, p313, 1971) is utilized to measure the effective acceptor concentration.

Actually, the infrared absorption spectrum of the sample is measured using a micro IR equipment, and the absorbance $a_1$ at wave number of 1280 [1/cm] or the absorbance $a_2$ at a wave number of 2800 [1/cm] is calculated. When the boron concentration within the crystal is approximately 10 ppm or more, the former ($a_1$) is effective, and when it is less than 10 ppm, the latter ($a_2$) is effective.

The conversion formula of the former and latter values is represented by $a_2/a_1=22$.

When the film thickness is represented by d (cm), the effective acceptor concentration ($N_A$) in the crystal can be calculated by the following equation.

$$N_A = 0.086 \times a_1/d$$

Secondary ion mass spectroscopy (SIMS) is used to quantify the boron concentration within the diamond crystal accurately. By utilizing the SIMS method, the total boron concentration including the boron atoms that are inactive as acceptor can be measured. The boron within the diamond crystal forms an acceptor level at approximately 350 meV above the valence band, and some of them become activated at room temperature and function as acceptors. Therefore, the effective acceptor concentration according to the infrared spectroscopy at room temperature is smaller compared to the total boron concentration.

The intensity ratio of intensity of the free exciton recombination radiation and the boron-derived bound exciton recombination radiation (FE/BE ratio) measured by CL method at −190° C. indirectly represents the boron concentration within the diamond crystal. (Refer to H. Kawarada et al., Physical Review B, vol. 47, p. 3633–3637 (1993).)

The samples are grown by varying the ratio of boron atoms against the carbon atoms within the atmosphere when growing the CVD diamonds, and tests are performed for example to check whether the current-injection free exciton radiation is observed or not.

In embodiment 3 the B/C ratio during growth is 50 ppm, in embodiment 7 the B/C ratio during growth is 1000 ppm, in comparison example 6 the B/C ratio during growth is 1500 ppm, in comparison example 7 the B/C ratio during growth is 3000 ppm, and in comparison example the B/C ratio during growth is 5000 ppm.

In embodiments 3 and 7, the free exciton recombination radiation based on current injection is observed, but in the comparison examples 6, 7 and 8, no free exciton recombination radiation based on current injection is observed.

Based on the above fact, it is understood that in order to obtain the diamond ultraviolet light-emitting device, the ratio of boron atoms to carbon atoms within the plasma during growth must be 1000 ppm or less.

As a result of quantification of the active acceptor concentration within the crystal utilizing the IR method, the concentration of embodiment 3 is 2 ppm and the concentration of embodiment 7 is 20 ppm. However, the boron concentration according to comparison examples 6, 7 and 8 are above the limit of measurement by the IR method.

Accordingly, it is understood that in order to obtain the diamond ultraviolet light-emitting device, the active acceptor concentration within the crystal according to the IR measurement method must be 20 ppm or less.

The peak intensity ratio (FE/BE) of the free exciton recombination radiation and the boron-derived bound exciton recombination radiation is measured based on CL method at −190° C., and the result is 2.3 for embodiment 3, 0.10 for embodiment 7, 0.03 for comparison example 3, and below the limit of measurement for both comparison examples 7 and 8.

Accordingly, it is understood that in order to obtain the diamond ultraviolet light-emitting device, the peak intensity ratio (FE/BE) of the free exciton recombination radiation to the boron-derived bound exciton recombination radiation measured by CL at −190° C. must be 0.10 or higher, or in other words, the ratio must be 0.1 times or higher.

The boron concentration of the samples of embodiment 7 and comparison example 6 are analyzed by SIMS, wherein the former is 60 ppm and the latter is 300 ppm.

Therefore, in order to obtain the diamond ultraviolet light-emitting device, the boron concentration within the crystal must be 60 ppm or less according to the analysis by the SIMS method.

The prior art lacks to propose manufacture method of a current injection diamond light-emitting device by intentionally limiting the nitrogen concentration or the boron concentration within the crystal. This is because the conventional diamond light-emitting device only emitted ultraviolet light caused by impurities or lattice defects, and did not utilize the free exciton recombination radiation that is intrinsic to diamond and is utilized in the present invention.

As explained, the present invention provides a diamond ultraviolet light-emitting device utilizing a CVD diamond in which the current-injection free exciton recombination radiation is dominant.

In the detailed description, the insulative diamond crystal film 1 can either be monocrystal or polycrystal.

Further, electric conductivity can be provided to the diamond either by hydrogen-termination of the crystal surface or by doping boron so as to create a p-type semiconductor.

INDUSTRIAL APPLICABILITY

As explained, the diamond ultraviolet light-emitting device utilizing the CVD diamond crystal according to the present invention can generate a short-wavelength ultraviolet radiation caused by current injection.

We claim:

1. A diamond ultraviolet light-emitting device, comprising:
    a diamond crystal formed by a chemical vapor deposition (CVD) process;
    a first electrode formed on the diamond crystal; and
    a second electrode formed on the diamond crystal, wherein when current injection is performed between the first and second electrode, the diamond ultraviolet light-emitting device dominantly emits a light of a free exciton recombination radiation, having a peak wavelength of 235 nm, 242 nm, 249 nm, or 257 nm.

2. A diamond ultraviolet light-emitting device according to claim 1 in which the free exciton recombination radiation excited by current injection is dominant, wherein the peak intensity of the free exciton recombination radiation is stronger than at least twice the peak intensity of other radiations in the wavelength region below 300 nm.

3. A diamond ultraviolet light-emitting device according to claims 1, wherein the nitrogen concentration within said CVD diamond crystal is 90 ppm or less.

4. A diamond ultraviolet light-emitting device according to claim 1, wherein the diamond crystal is formed under a plasma having a nitrogen concentration of 200 ppm or less in a ratio of nitrogen atoms/carbon atoms.

5. A diamond ultraviolet light-emitting device according to claim 1, wherein said CVD diamond crystal is monocrystal.

6. A diamond ultraviolet light-emitting device according to claim 1, wherein said CVD diamond crystal is a CVD diamond crystal grown homoepitaxially.

7. A diamond ultraviolet light-emitting device according to claim 1, wherein said CVD diamond crystal is polycrystal.

8. A diamond ultraviolet light-emitting device according to claim 1, wherein the first electrode and/or the second electrode is formed on a surface of the diamond crystal, the surface being a growing surface in the chemical vapor deposition (CVD) process.

9. A diamond ultraviolet light-emitting device according to claim 1, wherein when the diamond ultraviolet light-emitting device is subjected to a cathode luminescence spectrum method at room temperature, the diamond ultraviolet light-emitting device emits the free exciton recombination radiation.

10. A diamond ultraviolet light-emitting device according to claim 1, wherein when the diamond ultraviolet light-emitting device is subjected to a cathode luminescence spectrum method at −190° C., the diamond ultraviolet light-emitting device emits the free exciton recombination radiation at an intensity ratio (FE/VE) of 0.2 or more, wherein FE represent a peak intensity of the free exciton recombination radiation, and VE represents a peak intensity of a visible radiation.

11. A diamond ultraviolet light-emitting device according to claim 1, wherein said CVD diamond crystal comprises a conductive layer at the surface thereof, and electrodes formed on said conductive layer.

12. A diamond ultraviolet light-emitting device according to claim 1, wherein said CVD diamond crystal comprises a conductive layer at the surface thereof formed by hydrogen-termination, and electrodes formed on said hydrogen termination layer.

13. A diamond ultraviolet light-emitting device according to claim 1, wherein conductivity is provided to said CVD diamond crystal by doping boron thereto.

14. A diamond ultraviolet light-emitting device according to claim 1, wherein the boron concentration within said CVD diamond is 60 ppm or less.

15. A diamond ultraviolet light-emitting device according to claim 1, wherein chemical vapor deposition (CVD) diamond crystal is formed under a plasma having a boron concentration of 1000 ppm or less in a ratio of boron atoms/carbon atoms.

16. A diamond ultraviolet light-emitting device according to claim 1, wherein the diamond crystal has an effective acceptor concentration of 20 ppm or less based on infrared absorption spectroscopy.

17. A diamond ultraviolet light-emitting device according to claim 1, wherein when the diamond ultraviolet light-emitting device is subjected to a cathode luminescence spectrum method at −190° C., the diamond ultraviolet light-emitting device emits the free exciton recombination radiation at an intensity ratio (FE/BE) of 0.1 or more, wherein FE represent a peak intensity of the free exciton recombination radiation, and BE represents a peak intensity of a boron-derived bound exciton recombination radiation.

* * * * *